(12) United States Patent
Tillman et al.

(10) Patent No.: US 7,684,972 B2
(45) Date of Patent: Mar. 23, 2010

(54) TERMINATION ASSESSMENT OF A COMPUTER SIMULATION

(75) Inventors: Steven T. Tillman, Huntsville, AL (US); Andrew J. Witzig, Harvest, AL (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 950 days.

(21) Appl. No.: 11/336,859

(22) Filed: Jan. 23, 2006

(65) Prior Publication Data

US 2007/0174032 A1 Jul. 26, 2007

(51) Int. Cl.
*G06F 9/45* (2006.01)
*G06G 7/48* (2006.01)

(52) U.S. Cl. .............................. 703/22; 703/5
(58) Field of Classification Search .................. 703/22, 703/5
See application file for complete search history.

(56) References Cited

U.S. PATENT DOCUMENTS

| 6,173,249 | B1 * | 1/2001 | Huang et al. | .................. 703/27 |
| 6,195,625 | B1 * | 2/2001 | Day et al. | ...................... 703/7 |
| 6,725,188 | B1 | 4/2004 | Shingai et al. | |

OTHER PUBLICATIONS

J. W. Swegle, "An Analysis of Smoothed Particle Hydrodynamics", Mar. 1994, SAND93-2513.

J. J. Monaghan, "Smoothed Particle Hydrodynamics", Annu. Rev. Astron. Astrophys. 1992. 30: 543-74, Publisher: Annual Reviews Inc.

L. B. Lucy, "A Numerical Approach to the Testing of the Fission Hypothesis", Dec. 1977, vol. 82, No. 12, Publisher: The Astronomical Journal.

R. A. Gingold et al., "Smoothed Particle Hydrodynamics: Theory and Application to Non-spherical Stars", Mon. Not. R. astr. Soc. (1977) 181, 375-389, Publisher: Royal Astronomical Society.

PCT International Search Report and Written Opinion in counterpart International Application No. PCT/US07/60687, dated Feb. 14, 2008.

* cited by examiner

*Primary Examiner*—Kamini Shah
*Assistant Examiner*—Saif Alhija
(74) *Attorney, Agent, or Firm*—Edell, Shapiro & Finnan, LLC (57) ABSTRACT

A method is provided for assessing whether to terminate a computer-implemented simulation of a physical experiment. Computations associated with the computer-implemented simulation that model the physical experiment are executed and to determine if a desired outcome associated with the physical experiment will occur. The results of the computations are evaluated to determine if the results indicate that the desired outcome has occurred. If the desired outcome has not occurred, periodically the results of the computations are evaluated with respect to at least one negative indication that the desired outcome is not possible and thus not likely going to occur. If the at least one negative indication is present, the computations associated with the computer-implemented simulation is terminated.

30 Claims, 5 Drawing Sheets

TERMINATION ASSESSMENT OF A COMPUTER SIMULATION

FIELD OF THE INVENTION

The present invention relates to computer simulations of physical phenomena, and more particularly to terminating the computer simulation when it is determined that a desired outcome will likely not occur.

BACKGROUND OF THE INVENTION

Computer simulations for experiments involving the impact of one object with another object have widespread applications. For example, automobile manufacturers use such simulations in designing safer vehicles. In a totally different technology field, scientist uses such simulations to study the effectiveness of a missile destroying a moving or stationary target. Regardless of the particular application, it is an overall goal to design a computer simulation that can accurately produce data concerning possible outcomes of the physical phenomena of interest pertaining to two or more objects. However, there is a tradeoff between accuracy and simulation run time. Generally, the more complex a simulation is in order to achieve better accuracy, the longer it takes for that simulation to run to completion. In fact, very complex computer simulations, such as so-called "hydrocodes" can take several days or longer to execute on highly sophisticated models of certain physical events.

In many cases, it could be known that that the desired outcome of the computer simulation will not be possible by monitoring the results of the computations for certain indications. Consequently, the computer simulation can be stopped much sooner and save researchers a significant amount of time.

SUMMARY OF THE INVENTION

Briefly, a method is provided for assessing whether to terminate a computer-implemented simulation of a physical experiment. Computations associated with the computer-implemented simulation that model the physical experiment are executed and to determine if a desired outcome associated with the physical experiment will occur. The results of the computations are evaluated to determine if the results indicate that the desired outcome has occurred. If the desired outcome has not occurred, periodically the results of the computations are evaluated with respect to at least one negative indication that the desired outcome is not possible and thus not likely going to occur. If the at least one negative indication is present, the computations associated with the computer-implemented simulation is terminated, avoiding further unnecessary computations and saving time waiting for the results of the simulation.

DETAILED DESCRIPTION

Figure 1:
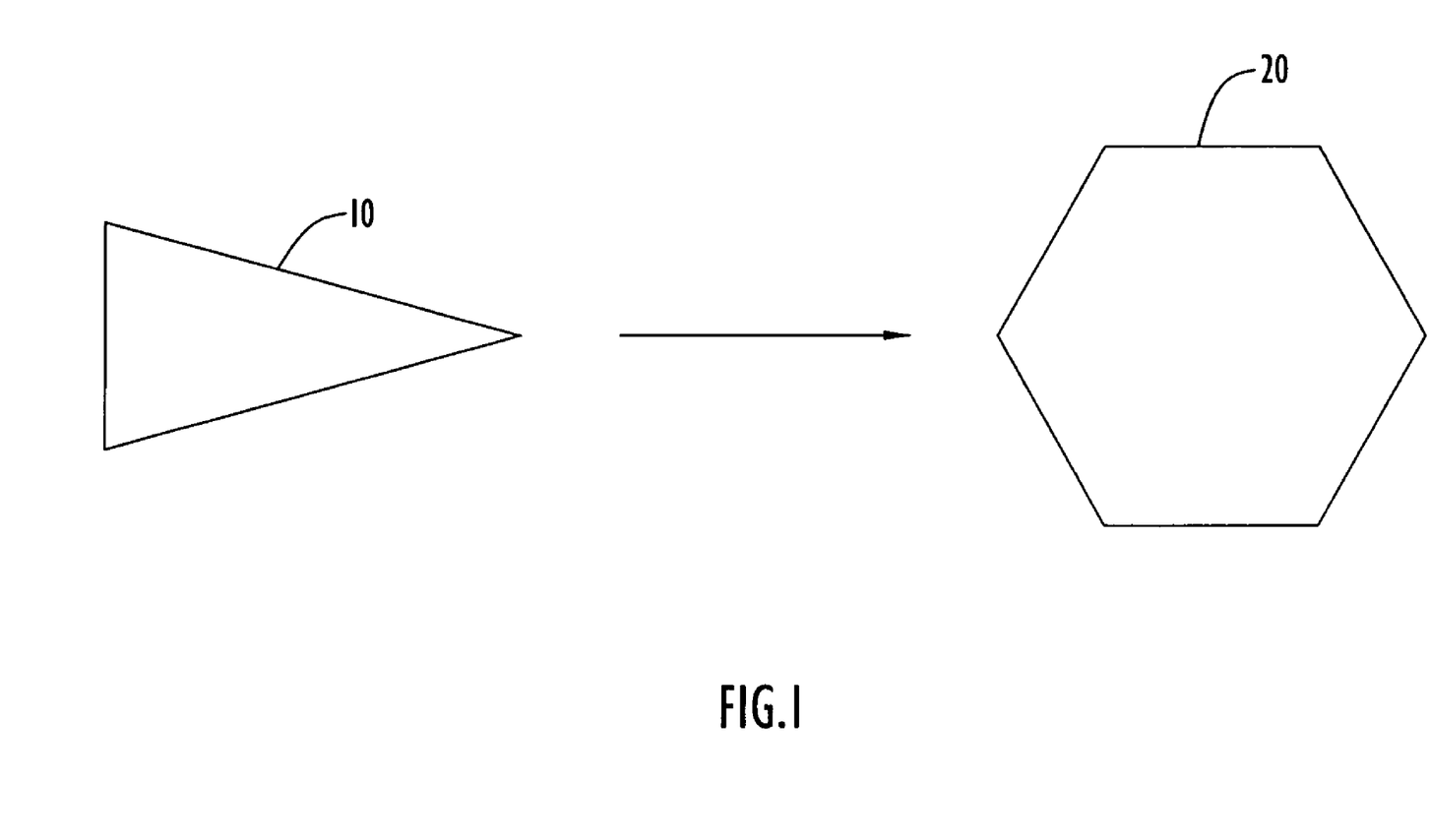
FIG. 1 is a diagram depicting two objects involved in a physical interaction that is modeled by a computer-implemented simulation to whether a desired outcome will occur.

Referring first to FIG. 1, an experiment is depicted in which a first object 10 is to collide with a second object 20. The objects 10 and 20 could be any two objects that may collide with each other, or one of which may explode or detonate near or on the other, etc. Either or both objects may be moving, or both objects may be stationary. Non-limiting examples of the experiment include: object 20 is stationary (e.g., a building structure) and object 10 is moving and collides or explodes near object 20, where object 10 is a moving vehicle such as a land vehicle, air vehicle (airplane, missile, etc.); object 20 is moving and object 10 is moving and the two objects collide with each other, one of which may or may not set off an explosion upon or near impact, where object 20 is an air vehicle and object 10 is an air vehicle; objects 10 and 20 are both stationary and one explodes inside or near the other object. It should be understood that while only two objects are shown in FIG. 1, the experiment may involve more than two objects.

Figure 2:
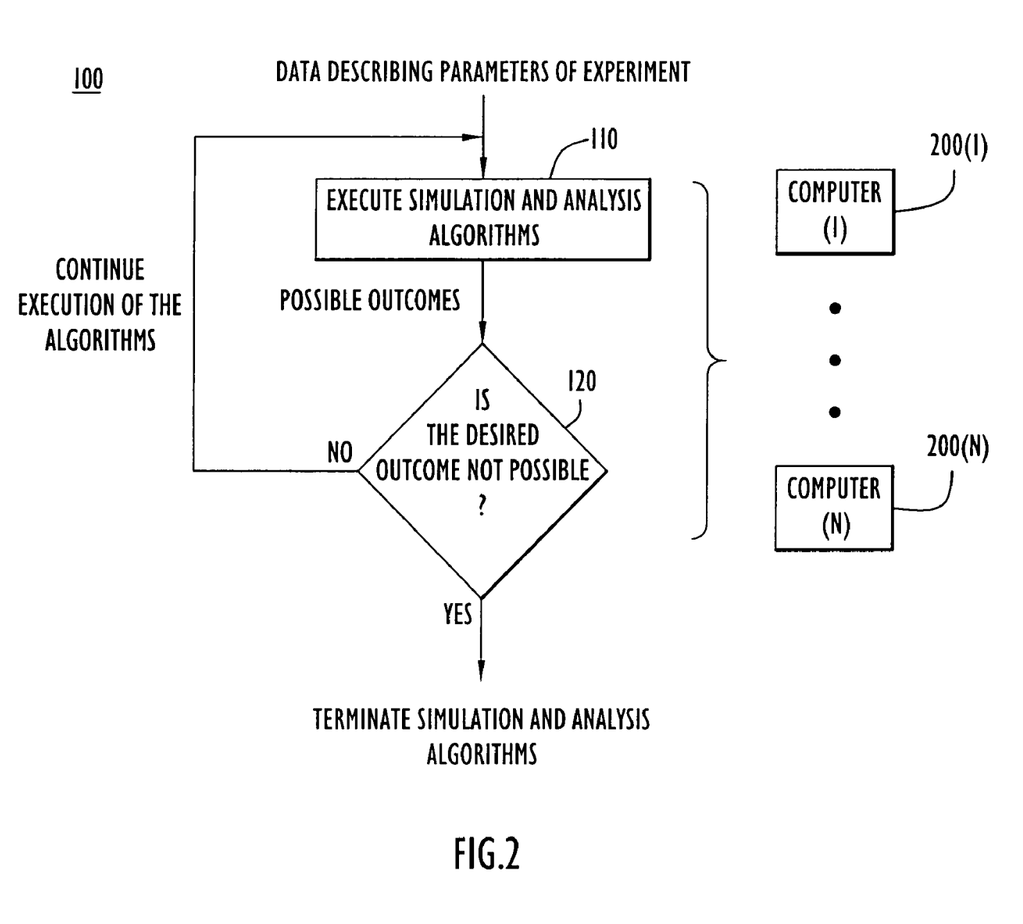
FIG. 2 is a flow chart generally depicting a procedure for terminating a computer simulation of an experiment when it is determined that a desired outcome is not possible according to the present invention.

For these types of experiments, simulation algorithms have been, and are being, developed to predict the possible outcomes of such events using computations that represent the various physical phenomena occurring. With reference to FIG. 2, a generalized procedure 100 is shown for assessing when to terminate a computer simulation executed by one or more computers 200(1) to 200(N). At reference numeral 110, the computations associated with one or more simulation algorithms are executed. While these computations are being performed, a determination is made at step 120 whether a desired outcome of the computer simulation is not possible given the current state of the computations. In this way, before a significant period of time has passed from initiating execution of the simulation algorithms, the computations can be terminated if it can be determined that the desired outcome is not possible. On the other hand, if it cannot yet be determined that the desired outcome is not possible, then the simulation algorithms are not terminated.

Figure 3:
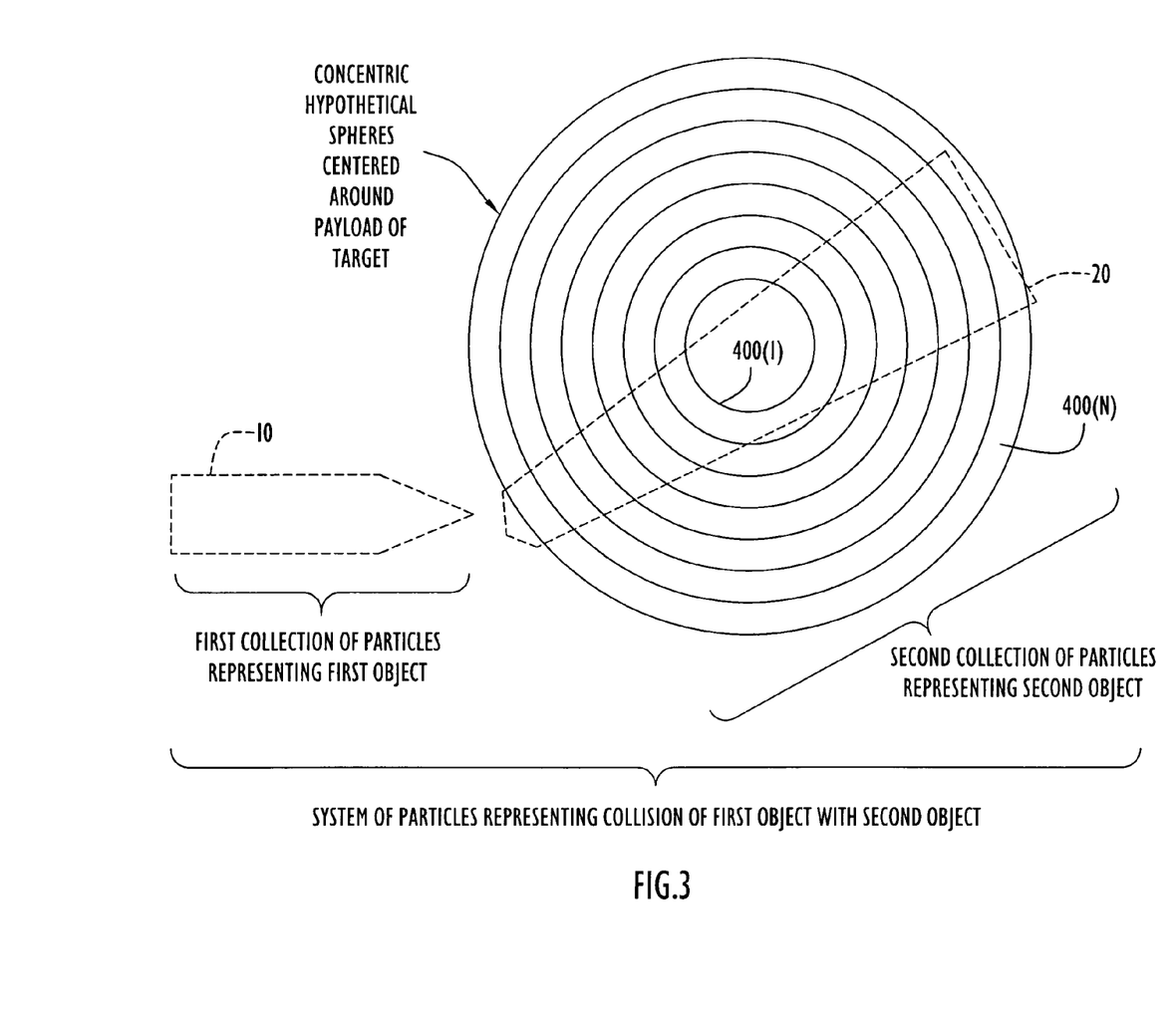
FIG. 3 is a diagram depicting interaction of two objects each represented by a collection of particles according to an embodiment of the invention.
Figure 4:
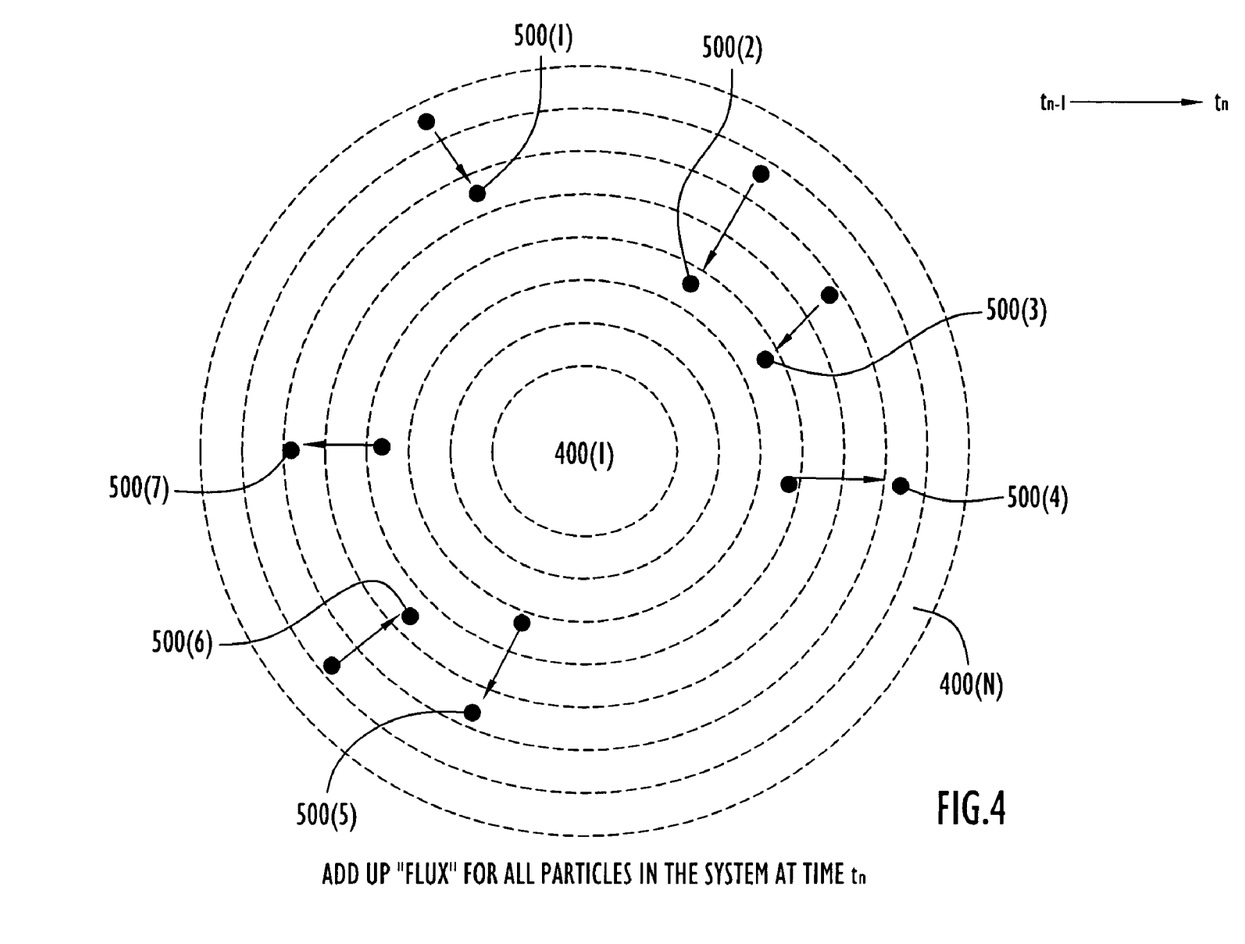
FIG. 4 is a diagram depicting characteristics of particles representing two objects according to an embodiment of the invention.
Figure 5:
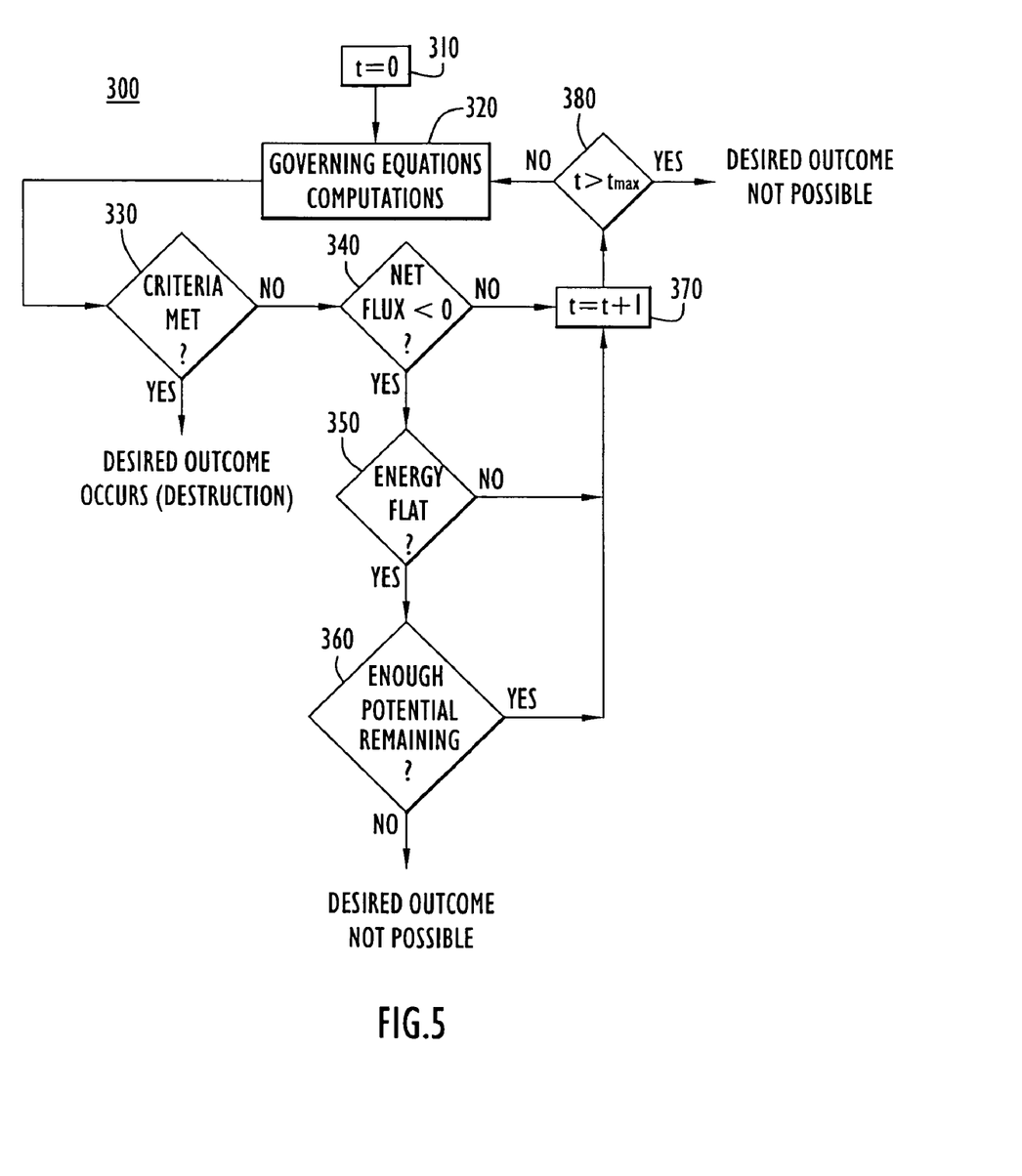
FIG. 5 is a flow chart of a procedure for terminating a computer-implemented simulation of the physical interaction of at least two objects according to an embodiment of the invention.

Turning to FIGS. 3-5, a more specific example of a termination assessment procedure will be described according to an embodiment of the invention. One example of a computer simulation algorithm employs a so-called physics model using smooth particle hydrodynamics (SPH) to approximate variables over finite domains of compact support. SPH is a LaGrangian technique originally formulated to solve astrophysics problems, but has been expanded and enhanced to include material strength effects making the method attractive for hypervelocity impact problems.

SPH does not rely on a traditional grid to quantify node relationships but rather uses interpolation theory to compute smooth field variables at discrete spatial locations throughout the computational domain. Using the theory, the function f at the spatial location, r, may be approximated as:

$$\langle f(r) \rangle = \int f(r_j) W(\vec{r} - \vec{r}_j, h) d\vec{r} \tag{1}$$

where $r_j$ is a new independent variable and W is an appropriate weighting function usually chosen to have the following properties:

$$\int_{-2h}^{2h} W(\vec{r}_i - \vec{r}_j, h) d\vec{r} = 1 \quad (2)$$

$$W(\vec{r}_i - \vec{r}_j, h) = 0 \text{ for } |\vec{r}_i - \vec{r}_j| \geq 2h \quad (3)$$

$$\lim_{h \to 0} [W(\vec{r}_i - \vec{r}_j, h)] = \delta(\vec{r}_i - \vec{r}_j, h) \quad (4)$$

And where h is a so-called smoothing length that defines the region of compact support known as the Kernel and $\delta$ is the Delta function. The first and second properties ensure compact support while the third property ensures convergence. Although many different functions satisfy the above three properties, one such function is the $3^{rd}$ order B-spline function.

Equation (1) may be converted to a summation if the function, f(r), is only known at discrete points of corresponding volume ($m_j/\rho_j$) where $m_j$ and $\rho_j$ are the mass and density of interpolation point, j, respectively. Details of the derivation are known in the literature and are not repeated here. The resulting summation is:

$$\langle f(r) \rangle = \sum_{j=1}^{N} \frac{m_j}{\rho_j} f(r_j) W(\vec{r} - \vec{r}_j) d\vec{r} \quad (5)$$

Gradients of the function, f(r), may also be converted to summations. The resulting expression is given below.

$$\nabla \langle f(r) \rangle = \sum_{j=1}^{N} \frac{m_j}{\rho_j} f(r_j) \nabla W(\vec{r} - \vec{r}_j) d\vec{r} \quad (6)$$

Together equations (5) and (6) form the basis of the SPH method and allow the partial differential equations of the Newtonian conservation laws to be transformed into discrete summations of neighboring interpolation points.

These interpolation points are the particles referred to above. At every time step, the density, velocity, and energy of each particle are updated by solving appropriate conservation of mass, momentum, and energy equations. Particle positions are updated by integrating particle velocities over time steps selected to satisfy stability criteria. The conservation laws and the resulting particle relationships employed are provided in Table 1.

TABLE 1

| | | Conservation Laws | |
|---|---|---|---|
| Property | Governing Relationship | Particle Relationship | |
| Mass | $\frac{D\rho}{Dt} = -\rho \frac{\partial v^\alpha}{\partial x^\alpha}$ | $\frac{D\rho_i}{Dt} = -\sum_j m_j (v_{ji}^\beta) \frac{\partial W_i}{\partial x^\beta}$ | |
| Momentum | $\rho \frac{Dv^\alpha}{Dt} = \frac{\partial \sigma^{\alpha\beta}}{\partial x^\beta}$ | $\frac{Dv_i^\alpha}{Dt} = \sum_j m_j \left( \frac{\sigma_i^{\alpha\beta}}{\rho_i^2} + \frac{\sigma_j^{\alpha\beta}}{\rho_j^2} \right) \frac{\partial W_i}{\partial x^\beta}$ | |
| Energy | $\rho \frac{De}{Dt} = -\rho \frac{\partial v^\alpha}{\partial x^\alpha} + S^{\alpha\beta} \frac{\partial v^\alpha}{\partial x^\beta}$ | $\frac{De_i}{Dt} = -\sum_j \frac{m_j P_j}{\rho_j^2} (v_{ji}^\beta) \frac{\partial W_i}{\partial x^\beta} + \frac{1}{2} \sum_j \frac{m_j S_j^{\alpha\beta}}{\rho_j^2} \left[ (v_{ji}^\alpha) \frac{\partial W_i}{\partial x^\beta} + (v_{ji}^\beta) \frac{\partial W_i}{\partial x^\alpha} \right]$ | |
| Position | $\frac{Dx^\alpha}{Dt} = v^\alpha$ | $\frac{Dx_i^\alpha}{Dt} = v_i^\alpha$ | | where subscripts i and j refer to individual and neighbor particles, respectively, and $v_{ij} = v_j - v_i$.

The artificial viscosity is included in both the energy and momentum conservation equations. The artificial viscosity contains a bulk viscosity to suppress post-shock velocity oscillations and a Neumann-Richtmeyer viscosity to dissipate shock energy. Weighting functions of the two forms, $\alpha$ and $\beta$, are taken to be unity.

Each particle's sound speed is updated at every time step via the following relationship:

$$C_{s,i}^2 = \left( \frac{\partial P_i}{\partial \rho_i} \right)_s \quad (7)$$

where the partial derivative of pressure with respect to density is evaluated with respect to constant entropy.

The stress tensor, strain rate tensor, rotation rate tensor, constitutive relationship and equation of state employed are listed in Table 2 along with accompanying particle relationships. The time rate of change of the stress deviator tensor is provided via the well known Jaumann rate equation. All materials are assumed to behave elastic-plastic with material failure checked against the von Mises yield criteria. For plastic deformations, an appropriate flow rule is used to relax stresses to the yield surface. The Mie-Gruneisen equation of state relates pressure to material density and internal energy.

TABLE 2

Constitutive Relationships and Equation of State

| Property | Governing Relationship | Particle Relationship | |
|---|---|---|---|
| Stress Tensor | $\sigma^{\alpha\beta} = S^{\alpha\beta} - \delta^{\alpha\beta} P$ | $\sigma_i^{\alpha\beta} = S_i^{\alpha\beta} - \delta^{\alpha\beta} P_i$ | |
| Strain Rate Tensor | $d^{\alpha\beta} = \frac{1}{2}\left(\frac{dv^{\alpha}}{dx^{\beta}} + \frac{dv^{\beta}}{dx^{\alpha}}\right)$ | $d_i^{\alpha\beta} = \frac{1}{2}\sum_j \frac{m_j}{\rho_j}\left[(v_{ji}^{\alpha})\frac{\partial W_i}{\partial x^{\beta}} + (v_{ji}^{\beta})\frac{\partial W_i}{\partial x^{\alpha}}\right]$ | |
| Rotation Rate Tensor | $R^{\alpha\beta} = \frac{1}{2}\left(\frac{dv^{\alpha}}{dx^{\beta}} - \frac{dv^{\beta}}{dx^{\alpha}}\right)$ | $R_i^{\alpha\beta} = \frac{1}{2}\sum_j \frac{m_j}{\rho_j}\left[(v_{ji}^{\beta})\frac{\partial W_i}{\partial x^{\beta}} - (v_{ji}^{\beta})\frac{\partial W_i}{\partial x^{\alpha}}\right]$ | |
| Constitutive Relationship | $\sigma^{\alpha\beta,\nabla} = \frac{D}{Dt}\sigma^{\alpha\beta} + R^{k\alpha}\sigma^{k\beta} + R^{r\beta}\sigma^{\alpha r}$ | $\frac{dS_i^{\alpha\beta}}{dt} = 2G\left(d_i^{\alpha\beta} - \frac{1}{3}\delta^{\alpha\beta}d_i^{kk}\right) + R_i^{\alpha k}S_i^{k\beta} + R_i^{\beta r}S_i^{\alpha r}$ | |
| Equation of State | $P = P_H\left(1 - \frac{\Gamma_0}{2}\eta\right) + \Gamma_0\rho_0 e$ | $P_i = P_{H,i}\left(1 - \frac{\Gamma_{0,i}}{2}\eta_i\right) + \Gamma_{0,i}\rho_{0,i} e_i$ | | where $P_H$ refers to the Hugoniot pressure and $\eta$ is the compression ratio $(1-\rho_0/\rho)$.

Numerical stability is assured by satisfaction of the Courant condition. One technique selects appropriate time steps based on the minimum ratio of smoothing length to sound speed, smoothing length to particle velocity, and square root of the ratio of smoothing length to particle acceleration for all particles within the computational domain at every time step.

$$\Delta t = \sum_{i=1}^{N} \min\left[\left(\frac{h_i}{C_{s,i}}\right), \left(\frac{h_i}{v_i}\right), \sqrt{\frac{h_i}{a_i}}\right] \quad (8)$$

Any number of schemes known in the art may be used for integrating the system of equations. One technique is a scheme that is accurate to the order of $(\Delta t)^2$.

FIG. 3 shows an example of a system that is modeled with data for a first collection of particles representing a first object 10 and data for a second collection of particles representing a second object 20. Moreover, according to one application of the techniques of the present invention, it is desirable to assess when to terminate a computer simulation of an experiment in which the first object 10 makes impact or engagement with the second object 20 for the purpose of causing destruction of a second object 20 (or a portion of the second object 20). The second object 20 may be referred to as a target object and the first object 10 may be referred to as an interceptor object. The desired outcome is destruction of the second object, and in particular a payload portion of the second object.

Data is generated to represent a plurality of areas in two-dimensions or three-dimensions describing areas or volume regions in which the movement of particles is tracked from one time step to the next time step. For example, FIG. 3 shows hypothetical concentric spheres 400(1) to 400(N) around a particular portion, e.g., the payload, of the second object 20. The spheres 400(1) to 400(N) may extend from an outer skin or surface of the second object (or its payload) to a tip of the second object 20. The concentric spheres are only an example of a method for tracking movement of particles in three dimensions. The areas or volume regions need not be concentric, and instead may be stacked or adjacent to each other spanning out from an area or region of interest. However, by arranging the areas or regions concentrically, a scheme can be used by which the movement of particles into certain regions or areas can be given greater weight than movement of particles into other regions.

A quantity is defined called "flux", which is a measure of the number of particles moving across an area or volume region, such as movement among the concentric spheres shown in FIG. 3. The amount flux passing through the concentric spheres is examined while the computer simulation is running in order to determine at least one indicator of whether a desired outcome, e.g., destruction of the object 20 and in particular its payload, will likely occur if the simulation is continued.

Turning to FIG. 4, a further explanation of the system of particles is described as it pertains to assessing whether to terminate the computer simulation. In FIG. 4, only 7 particles are shown for simplicity, but it should be understood that the system may comprise numerous particles that represent the two objects involved in the simulation. Each active particle in the system is tracked at each time step of the computer simulation computations so that the particle's position, energy, mass, pressure, stress and velocity are known at each time step. A particle is said to contribute a positive "flux" at time step $t_n$ when it has moved closer to the payload (or some point relative to the colliding objects) with respect to its position at the previous time step, $t_{n-1}$. On the other hand, a particle is said to contribute a negative flux at time $t_n$ when it has moved further from the payload (or some point relative to the colliding objects) with respect to its position at the previous time step, $t_{n-1}$. Moreover, a particle that moves to one of the spheres closer to the payload, e.g., will contribute a greater positive flux weight because it has moved into a sphere of a smaller area or volume, which by the definition of "flux" described above (particle movement/area or volume, will be greater than if it moved from a smaller sphere to a larger sphere. Flux is measured by examining the particles in a particular sphere at the current time step and determining from which other sphere the particle moved from at the previous time step to reach its position in the sphere it is located at the current time step. By determining the movement of each particle, both in direction (towards a target region or away from a target region) and size of the area or region that the particle moved since the previous time step, the flux contribution of that particle is computed. This computation is performed for all of the particles in each sphere and the total flux of the system is computed by adding the flux contribution from each particle in the system.

In the example of FIG. 4, particles 500(1), 500(2), 500(3) and 500(6) will each contribute a positive flux at time step $t_n$ because they have moved from an outer sphere to an inner sphere with respect to the payload or target region. By contrast, particles 500(4), 500(5) and 500(7) will contribute a negative flux at time step $t_n$ because they have moved from an inner sphere to an outer sphere with respect to the payload. Moreover, particles 500(2) and 500(3) will contribute a greater amount of flux than particles 500(1) and 500(6) because particles 500(2) and 500(3) have moved within a sphere closer to the payload, and thus a sphere having a smaller area, than particles 500(1) and 500(6).

To compute a net flux of the system at a current time step $t_n$, the flux contribution of all of the particles in the system is summed in the manner described above. If the net flux is greater than zero, this indicates that in general more particles are moving toward the payload than away, which is a positive indicator that there is a good possibility that destruction of the payload, the desired outcome, will occur. If the net flux is less than zero, this indicates that in general more particles are moving away from the payload than towards it, which is an indicator that the desired outcome, destruction of the payload, is less likely to occur. In the example of FIG. 4, the net flux would be greater than zero because there are more particles (4) moving toward the payload than particles (3) moving away from the payload. In general, when two objects collide, there will be a significant ramp up of positive net flux shortly after the collision, and then particles will begin to move away from the collision and the net flux will go negative.

There are other parameters or conditions in a particle-based computer simulation technique that can be used as indications that the desired outcome will not occur. One such parameter is the energy versus time curve for the system of particles or for the collection of particles representing only a particular one or more of the objects involved in the interaction. If the this energy versus time relationship has become generally flat or decreasing over recent time steps of the computations, then this is a indication that the desired outcome will not occur because it is unlikely at this point that sufficient energy could develop to meet the criterion in 330, for example.

Still another parameter in a particle-based system representation is the overall energy of the particles in the system, or the energy associated only with "positive" flux particles in the system. If either or both of these energy measures at a time step are less than a threshold, this is yet another indication that the desired outcome will not likely occur.

It should be understood that the negative indications described above in connection with the particle-based system representation of the object interaction are meant only as an example of the types of conditions that can be monitored to assess termination of the computer simulation. Different criteria may be used in various combinations for assessing when to terminate a computer simulation that use other types of data representations of the physical phenomena.

Turning to FIG. 5 with continued reference to FIGS. 3 and 4, a termination assessment algorithm 300 according to an embodiment of the invention will be described. This algorithm may be implemented by instructions stored on a computer-readable medium that, when executed by a computer (see FIG. 2), causes the computer to perform the steps described herein. The computer simulations start at 310 (some arbitrary time t=0) and at 320 the computations associated with the governing equations for the physical event being modeled are executed. These computations are typically complex depending on the nature of the simulation. For example, in determining whether the first object 10 impacts and destroys the second object 20, computations are made with regard to the laws of conservation for properties related to mass, energy, momentum and position described above. At 330, a determination is made whether certain criteria exist for a desired outcome, e.g., destruction of the second object 20. For example, at 330 the results of the computations made at 320 are examined to determine whether there is a sufficient amount of energy (in a particular region in space) resulting from the simulated collision of the objects to cause the desired outcome. The energy threshold used in step 330 depends on the particular type of physical experiment being modeled and the desired outcome for the experiment. In any event, if the test in 330 is met, then it can be declared that the desired outcome has occurred. If the criterion in 330 is not met, then at 340 a first of a several indicators, so-called secondary negative indicators, are examined to determine whether the desired outcome is not possible regardless how many additional computation time steps are permitted to occur, and therefore the computer simulation can be terminated.

Specifically, at 340, the net flux described above in connection with FIGS. 3 and 4, is examined. Since in that example the desired outcome is the destruction of the second object, then net flux should be greater than zero if the destruction of the second object is likely to occur. Therefore, when the net flux is less than zero, this is a first (negative) indication that the desired outcome is likely not going to occur. That is, when the net flux is less than zero, there are more particles moving away from the target region than there are particles moving toward the target region.

Next, at 350, the energy in a particular region or area (in space) of the system of particles is examined over time. If the energy versus time relationship for that region or area has become generally flat (or decreasing) over the last several time steps for, this is a second (negative) indication that the desired outcome is likely not going to occur. In this case, there has not been sufficient energy in a particular region in space caused by the engagement yet to trigger the condition in 330 and it is unlikely the energy level in that region in space will subsequently increase to that point if it has already flat-lined or is decreasing.

It should be understood that the regions or areas of interest used in the first and second negative indication tests 350 and 360 may involve examining the criteria in two or more regions or areas in space that pertain to a desired outcome. A priority may be given to activity in a particular one or more of the regions in space over others for purposes of determining whether the first and second negative indication tests are passed.

Next, at 360, the energy of the system of particles is examined to determine if there is enough potential remaining in the system to cause the desired outcome. For example, in the example of FIGS. 3 and 4, it is determined whether there is enough energy associated only with flux particles contributing a positive flux, those particles moving toward the target, to cause the desired outcome. If there is insufficient energy such associated with "positive" flux particles remaining in the system, this is yet a third (negative) indication that the desired outcome is unlikely to occur.

According to one embodiment, if the negative indicators of 340, 350 and 360 are determined to be present, then a declaration can be made the desired outcome is not possible and the computer simulation can be terminated. If any one of the negative indicators 340, 350 and 360 is determined not to be present, then the algorithm proceeds to the next time step as indicated at 370 and the computations of the governing equations are executed at 320 for the next time step unless a maximum time, $t_{max}$, is exceeded. If the maximum time, $t_{max}$, is exceeded, then a declaration is made that the desired outcome is not possible. After the computations are made for the next time step, the tests of 330-360 are repeated before deciding whether to proceed to yet another time step.

It should be understood that depending on a particular application, the termination assessment algorithm 300 may be modified so that the sequence of the negative indication tests at 340, 350, 360 may be different form that shown in FIG. 5. In addition, the algorithm 300 may be implemented such that only one or two of the three negative indication tests 340, 350, 360 needs to be passed before a declaration is made that the desired outcome is not possible and the computer simulation is terminated.

It should be understood that different criteria (or a single criterion) may be used to assessing whether to terminate a computer simulation depending on the particular physical phenomena being modeled by the computer simulation and the data representation techniques used in the computer simulation.

The system and methods described herein may be embodied in other specific forms without departing from the spirit or essential characteristics thereof. The foregoing embodiments are therefore to be considered in all respects illustrative and not meant to be limiting.

What is claimed is:

1. A method for assessing whether to terminate a computer-implemented simulation of a physical experiment, comprising:
   a. on one or more computing devices, executing computations associated with the computer-implemented simulation that model the physical experiment to determine if a desired outcome associated with the physical experiment will occur, wherein the computer-implemented simulation of the physical experiment is a computer-implemented simulation of at least two objects interacting with each other, and wherein each of the objects is represented by data describing a collection of particles, where each particle describes a mass, velocity and energy at a discrete spatial location associated with the object for a current time step of the simulation, and wherein executing computations comprises executing computations related to one or more of the laws of conservation of energy, mass and momentum with respect to the data describing the collection of particles for the at least two objects at each of a plurality of time steps of the interaction of the at least two objects, wherein executing further comprises computing for each particle data indicating a positive contribution of the particle when it is determined that the particle has moved towards a target region relative to the at least two objects, or data indicating a negative contribution of the particle when it is determined that the particle has moved away from the target region relative to the at least two objects, adding the contributions across the collection of particles for the at least two objects from the data computed for each of the particles to produce a net contribution;
   b. on the one or more computing devices, evaluating results of the computations to determine if the results indicate that the desired outcome has occurred, wherein the evaluating further comprises determining whether the net contribution is less than zero indicating that more particles are moving away from the target region than moving toward the target region and thus the desired outcome is likely not possible;
   c. if the desired outcome has not occurred, on the one or more computing devices, evaluating results of the computations with respect to at least one negative indication that the desired outcome is not possible prior to completion of the computer-implemented simulation of the physical experiment; and
   d. terminating the computations associated with the computer-implemented simulation on the one or more computing devices prior to completion of the computer-implemented simulation of the physical experiment if the at least one negative indication is present.

2. The method of claim 1, wherein (c) evaluating comprises evaluating results of the computations with respect to a plurality of negative indications that the desired outcome is not possible, wherein evaluating comprises evaluating the results with respect to the plurality of negative indications, and wherein (d) terminating comprises terminating the computations if each of the plurality of negative indications is present.

3. The method of claim 1, wherein (c) evaluating comprises evaluating results of the computations with respect to a plurality of negative indications that the desired outcome is not possible, wherein evaluating comprises evaluating the results with respect to the plurality of negative indications, and wherein (d) terminating comprises terminating the computations if at least any one of the plurality of negative indications is present.

4. The method of claim 1, wherein (b) evaluating comprises evaluating data representing the interaction of the at least two objects to determine whether sufficient energy exists at a particular spatial position that can cause destruction of said portion of at least one of the objects.

5. The method of claim 1, wherein (b) evaluating comprises evaluating the results of the computations to determine if there is sufficient energy at a particular region in space associated with the interaction of the at least two objects to cause said desired outcome.

6. The method of claim 5, wherein (b) evaluating comprises evaluating the results of the computations to determine if there is sufficient energy to destroy at least a portion of at least one of the two objects.

7. The method of claim 1, wherein (c) evaluating comprises evaluating the results of the computations related to interaction of the collections of particles representing the at least two objects with respect to the at least one negative indication that the desired outcome is not possible.

8. The method of claim 7, wherein (c) evaluating comprises evaluating results of the computations with respect to a plurality of negative indications that the desired outcome is not possible, wherein evaluating comprises evaluating the results with respect to the plurality of negative indications, and wherein (d) terminating comprises terminating the computations if each of the plurality of negative indications is present.

9. The method of claim 7, wherein (c) evaluating comprises evaluating results of the computations with respect to a plurality of negative indications that the desired outcome is not possible, wherein evaluating comprises evaluating the results with respect to the plurality of negative indications, and wherein (d) terminating comprises terminating the computations if at least any one of the plurality of negative indications is present.

10. The method of claim 1, wherein (c) evaluating comprises evaluating results of the computations to determine whether, with respect to results at a previous time step, there are more particles moving away from a particular region in space than there are particles moving toward said particular region in space to cause said desired outcome as a first negative indication that the desired outcome is not going to occur.

11. The method of claim 10, wherein (c) evaluating further comprises evaluating the energy associated with the particles at the least one particular region of space to determine whether an energy versus time relationship is generally flat or decreasing in said at least one particular region of space as a second negative indication that the desired outcome is not going to occur.

12. The method of claim 11, wherein (c) further comprises determining whether the energy associated with those particles moving toward said particular region of space is not sufficient to cause said desired outcome as a third negative indication that the desired outcome is not going to occur.

13. The method of claim 12, wherein (d) terminating comprises terminating the computations associated with the computer-implemented simulation when the first, second and third negative indications are present.

14. The method of claim 12, wherein (d) terminating comprises terminating the computations associated with the computer-implemented simulation when two of the first, second and third indications are present.

15. A method for assessing whether to terminate a computer-implemented simulation of physical interaction of at least first and second objects, comprising:
   a. on one or more computing devices, with respect to data describing first and second collections of particles associated with the first and second objects, respectively, where each particle describes a mass, velocity and energy at a discrete spatial location associated with a position of one of first and second objects, executing computations related to one or more of the laws of conservation of energy, mass and momentum at a time step wherein the executing further comprises computing for each particle data indicating a positive contribution of the particle when it is determined that the particle has moved towards a target region relative to the first and second objects, or data indicating a negative contribution of the particle when it is determined that the particle has moved away from the target region relative to the first and second objects, adding the contributions across the collection of particles for the at least two objects from the data computed for each of the particles to produce a net contribution;
   b. on the one or more computing devices, evaluating results of the computations to determine whether there is sufficient energy in at least one particular region in space to cause a desired outcome, wherein the evaluating further comprises determining whether the net contribution is less than zero indicating that more particles are moving away from the target region than moving toward the target region and thus the desired outcome is likely not possible;
   c. if the desired outcome has not occurred, on the one or more computing devices, evaluating results of the computations with respect to at least one negative indication that the desired outcome is not possible prior to completion of the computer-implemented simulation of the physical experiment; and
   d. terminating the computations associated with the computer-implemented simulation on the one or more computing devices prior to completion of the computer-implemented simulation of the physical experiment if the at least one negative indication is present, otherwise repeating (a)-(c) for a next time step.

16. The method of claim 15, wherein (b) evaluating comprises evaluating the results of the computations to determine if there is sufficient energy in said at least one particular region of space to destroy at least a portion of at least one of the first and second objects.

17. The method of claim 16, wherein (c) evaluating comprises evaluating results of the computations to determine whether, with respect to results at a previous time step, there are more particles moving away from said at least one particular region in space than there are particles moving toward said at least one particular region in space to cause said desired outcome as a first negative indication that the desired outcome is not going to occur.

18. The method of claim 17, wherein (c) evaluating further comprises evaluating the energy associated with the particles in said at least one particular region of space to determine whether energy versus time relationship is generally flat or decreasing in said at least one particular region of space as a second negative indication that the desired outcome is not going to occur.

19. The method of claim 18, wherein (c) evaluating further comprises determining whether the energy associated with those particles moving toward said at least one particular region of space is not sufficient to cause said desired outcome as a third negative indication that the desired outcome is not going to occur.

20. The method of claim 19, wherein (d) terminating comprises terminating the computations associated with the computer-implemented simulation when the first, second and third negative indications are present.

21. The method of claim 19, wherein (d) terminating comprises terminating the computations associated with the computer-implemented simulation when two of the first, second and third negative indications are present.

22. A computer-readable medium storing instructions that, when executed by a computer, cause the computer to:
   a. with respect to data describing first and second collections of particles associated with the first and second objects, respectively, involved in physical interaction, where each particle describes a mass, velocity and energy at a discrete spatial location position of the one of the first and second objects, execute computations related to one or more of the laws of conservation of energy, mass and momentum at a time step wherein the instructions that cause the computer to execute comprise instructions that cause the computer to compute for each particle data indicating a positive contribution of the particle when it is determined that the particle has moved towards a target region relative to the first and second objects, or data indicating a negative contribution of the particle when it is determined that the particle has moved away from the target region relative to the first and second objects, adding the contributions across the collection of particles for the first and second objects from the data computed for each of the particles to produce a net contribution;
   b. evaluate results of the computations to determine whether there is sufficient energy in at least one particular region in space to cause a desired outcome, wherein the instructions that cause the computer to evaluate comprise instructions that cause the computer to determine whether the net contribution is less than zero indicating that more particles are moving away from the target region than moving toward the target region and thus the desired outcome is likely not possible;
   c. if the desired outcome has not occurred, evaluate results of the computations with respect to at least one negative indication that the desired outcome is not possible prior to completion of the computer-implemented simulation of the physical experiment; and d. terminate the computations associated with the computer-implemented simulation prior to completion of the computer-implemented simulation of the physical experiment if the at least one negative indication is present, otherwise repeating (a)-(c) for a next time step.

23. The method of claim 1, wherein (a) executing comprises computing a greater positive contribution for a particle determined to move from a larger spherical region around the target region into a smaller spherical region that is closer to the target region.

24. The method of claim 15, wherein (a) executing comprises computing a greater positive contribution for a particle determined to move from a larger spherical region around the target region into a smaller spherical region that is closer to the target region.

25. The computer-readable medium of claim 22, wherein the instructions that cause the computer to (b) evaluate comprise instructions that cause the computer to evaluate the results of the computations to determine if there is sufficient energy in said at least one particular region of space to destroy at least a portion of at least one of the first and second objects.

26. The computer-readable medium of claim 25, wherein the instructions that cause the computer to (c) evaluate comprise instructions that cause the computer to evaluate results of the computations to determine whether, with respect to results at a previous time step, there are more particles moving away from said at least one particular region in space than there are particles moving toward said at least one particular region in space to cause said desired outcome as a first negative indication that the desired outcome is not going to occur.

27. The computer-readable medium of claim 26, wherein the instructions that cause the computer to (c) evaluate comprise instructions that cause the computer to evaluate the energy associated with the particles in said at least one particular region of space to determine whether an energy versus time relationship is generally flat or decreasing in said at least one particular region of space as a second negative indication that the desired outcome is not going to occur.

28. The computer-readable medium of claim 18, wherein the instructions that cause the computer to (c) evaluate comprise instructions that cause the computer to determine whether the energy associated with those particles moving toward said at least one particular region of space is not sufficient to cause said desired outcome as a third negative indication that the desired outcome is not going to occur.

29. The computer-readable medium of claim 28, wherein the instructions that cause the computer to (d) terminate comprise instructions that cause the computer to terminate the computations associated with the computer-implemented simulation when the first, second and third negative indications are present.

30. The computer-readable medium of claim 22, wherein the instructions that cause the computer to (a) execute comprise instructions that cause the computer to compute a greater positive contribution for a particle determined to move from a larger spherical region around the target region into a smaller spherical region that is closer to the target region.

* * * * *